(12) United States Patent
Yamaguchi (10) Patent No.: US 9,920,735 B2
(45) Date of Patent: Mar. 20, 2018

(54) DRIVE CONTROL CIRCUIT, AND IGNITION DEVICE FOR INTERNAL COMBUSTION ENGINE

(71) Applicant: DENSO CORPORATION, Kariya, Aichi-pref. (JP)

(72) Inventor: Motoo Yamaguchi, Anjo (JP)

(73) Assignee: DENSO CORPORATION, Kariya (JP)

(*) Notice: Subject to any disclaimer, the term of this patent is extended or adjusted under 35 U.S.C. 154(b) by 372 days.

(21) Appl. No.: 14/781,098

(22) PCT Filed: Apr. 15, 2014

(86) PCT No.: PCT/JP2014/002113
§ 371 (c)(1),
(2) Date: Sep. 29, 2015

(87) PCT Pub. No.: WO2014/171127
PCT Pub. Date: Oct. 23, 2014

(65) Prior Publication Data
US 2016/0061178 A1 Mar. 3, 2016

(30) Foreign Application Priority Data
Apr. 16, 2013 (JP) ................... 2013-085720

(51) Int. Cl.
*H02H 9/00* (2006.01)
*F02P 3/055* (2006.01)
(Continued)

(52) U.S. Cl.
CPC ............. *F02P 3/055* (2013.01); *F02P 3/0435* (2013.01); *F02P 7/077* (2013.01); *H03K 17/567* (2013.01)

(58) Field of Classification Search
USPC ......................................................... 361/56
See application file for complete search history.

(56) References Cited

U.S. PATENT DOCUMENTS

| 5,483,093 A | 1/1996 | Murakami |
| 7,207,325 B2* | 4/2007 | Ando ................ F02P 3/0554 |
| | | 123/618 |

(Continued)

FOREIGN PATENT DOCUMENTS

| JP | 54-040941 A | 3/1979 |
| JP | 03-10631 U | 1/1991 |
| JP | 2007-303317 A | 11/2007 |

OTHER PUBLICATIONS

International Search Report and Written Opinion of the International Searching Authority dated Jul. 15, 2014 issued in the corresponding International application No. PCT/JP2014/002113 (and English translation).

*Primary Examiner* — Ronald W Leja
(74) *Attorney, Agent, or Firm* — Posz Law Group, PLC (57) ABSTRACT

A drive control circuit includes: a first protection circuit connected between a signal input line and a ground line and clamps a voltage of AC noise superimposed on the signal input line at one clamp level; a second protection circuit connected between the signal input line and the ground line and clamps the voltage of the AC noise superimposed on the signal input line at an other clamp level; and a drive signal generation circuit generating the drive signal based on a comparison between a voltage in the signal input line and Vt. The input signal has binary levels including an L-level voltage VL and an H-level voltage VH, and a mean voltage of the AC noise is lower than a differential voltage between Vt and VL and higher than a differential voltage between Vt and VH.

12 Claims, 7 Drawing Sheets (51) Int. Cl.
*F02P 3/04* (2006.01)
*F02P 7/077* (2006.01)
*H03K 17/567* (2006.01)

(56) References Cited

U.S. PATENT DOCUMENTS

| | | |
|---|---|---|
| 2006/0027219 A1 | 2/2006 | Ando |
| 2006/0027220 A1 | 2/2006 | Kawakita et al. |
| 2015/0381170 A1* | 12/2015 | Yamamoto .............. F02P 3/055 327/109 |
| 2017/0207650 A1* | 7/2017 | Miyazawa ............ H02J 7/0068 |

* cited by examiner

DRIVE CONTROL CIRCUIT, AND IGNITION DEVICE FOR INTERNAL COMBUSTION ENGINE

CROSS REFERENCE TO RELATED APPLICATION

This application is U.S. national phase of International Patent Application No. PCT/JP2014/002113 filed on Apr. 15, 2014 and is based on Japanese Patent Application No. 2013-85720 filed on Apr. 16, 2013, the disclosures of which are incorporated herein by reference.

TECHNICAL FIELD

The present disclosure relates to a drive control circuit that generates a drive signal for a switching element for performing one of the conduction and cut-off of current flow in a load; and an ignition device for an internal combustion engine.

BACKGROUND ART

The ignition device for an internal combustion engine (hereinafter referred to as the ignition device) disclosed in Patent Literature 1 or the like has been increasingly reduced in size. This type of ignition device includes: a switching element applying or interrupting current flow in an ignition coil (i.e., load); and a control IC driving the switching element to turn on or off in response to an ignition signal (i.e., input signal) as a rectangular wave inputted from an engine ECU (i.e., electronic control device).

Since a high-frequency/high-voltage surge resulting from electrostatic discharge (i.e., ESD) may be applied to an input line (i.e., a signal input line) for the ignition signal, a surge protection circuit is provided in the input line. In addition, the measures against AC noise induced in the signal input line are also needed. Accordingly, as a circuit configured to protect the control IC from a negative surge and clamp the negative voltage of the AC noise, a diode connected between the signal input line and a ground line and having a cathode connected to the signal input line is used. The diode can be embedded in the control IC.

PRIOR ART LITERATURES

Patent Literature

[Patent Literature 1] JP 2006-46256-A

SUMMARY OF INVENTION

When the protection circuit using the foregoing diode is used, in a normal use mode, sufficient protection against the negative surge and the AC noise can be obtained. However, as a result of performing a test in a more severe noise environment to provide more reliable protection, a phenomenon in which the voltage levels of the ignition signal input at binary levels (e.g., 0 V/5 V) increased in the control IC was observed. If the levels of the ignition signal wholly increase, margins relative to a threshold voltage when a comparator determines the levels of the ignition signal (particularly the margin relative to the L level) may decrease to possibly degrade noise resistance.

It has been found that this difficulty can be solved by connecting a bypass capacitor which allows AC noise to pass therethrough between the signal input line and the ground line. However, the capacitive value of the bypass capacitor provided for such a purpose is extremely large (e.g., several microfarads) so that it is difficult to embed the bypass capacitor in the control IC. When the bypass capacitor is externally attached to the control IC, not only the size of the ignition device increases, but also an additional assembling operation is needed.

The present disclosure has been achieved in view of the foregoing circumstances and the object thereof is to provide a drive control circuit and an ignition device for an internal combustion engine which allow a switching element to be normally driven without an additional bypass capacitor even in a more severe noise environment.

A drive control circuit according to a first aspect of the present disclosure generates a drive signal for a switching element which applies or interrupts current flow in a load in accordance with an input signal. The drive control circuit includes first and second protection circuits and a drive signal generation circuit.

The first protection circuit is connected between a signal input line for the input signal and a ground line, and clamps a voltage of AC noise superimposed on the signal input line at a clamp level +Vp (i.e., +Vp>0). The second protection circuit is connected between the signal input line and the ground line, and clamps the voltage of the AC noise superimposed on the signal input line at a clamp level −Vn (i.e., −Vn<0). A drive signal generation circuit generates the drive signal based on a comparison between a voltage in the signal input line and a threshold value Vt.

The input signal has binary levels including an L-level voltage VL and an H-level voltage VH. The clamp levels +Vp and −Vn are set such that a mean voltage of the AC noise clamped at the clamp levels +Vp and −Vn is lower than a differential voltage (i.e., Vt−VL) between the threshold voltage Vt and the L-level voltage VL and higher than a differential voltage (i.e., Vt−VH) between the threshold voltage Vt and the H-level voltage VH.

The present inventors have found that the voltage levels of the input signal mentioned above fluctuate under the following effect. For example, a diode connected between a signal input line and a ground line and having a cathode connected to the signal input line clamps the negative voltage of AC noise induced in the signal input line, but does not have the function of clamping the positive voltage of the AC noise. Between the signal input line and the ground line, a protection circuit against a positive surge may be provided. However, in most cases, the positive surge protection circuit acts on a surge voltage having a voltage higher than that of the AC noise and does not have a clamping function on the AC noise.

As a result, the AC noise superimposed on the signal input line has a positive-negative asymmetrical waveform, and the mean voltage of the AC noise increases in a positive direction. Consequently, the drive signal generation circuit compares the input signal that has been shifted in the positive direction by the mean voltage to the threshold voltage Vt. Likewise, when a diode which clamps, e.g., the positive voltage of AC noise is provided, the mean voltage of the AC noise increases in a negative direction. Consequently, the drive signal generation circuit compares the input signal that has been shifted in the negative direction by the mean voltage to the threshold voltage Vt. As a result, the margin between the L-level voltage VL or the H-level voltage VH and the threshold voltage Vt decreases.

In accordance with the first aspect, the first protection circuit clamps the AC noise at the positive voltage +Vp, and the second protection circuit clamps the AC noise at the negative voltage −Vn. This improves the positive-negative asymmetry of the waveform of the noise superimposed on the signal input line. Accordingly, it is possible to reduce the magnitude of the mean voltage of the AC noise and inhibit fluctuations in the voltage level of the input signal due to the AC noise. As a result, noise resistance can be higher than in a conventional configuration. In addition, since the drive signal generation circuit operates so as to satisfy conditions given by (Vt−VH)<Clamped Mean Voltage of AC Noise< (Vt−VL), the drive signal generation circuit makes no mistakes in determining the level of the input signal. Consequently, even in a more severe noise environment, it is possible to normally drive the switching element without an additional bypass capacitor.

The first protection circuit may also include: a transistor having a current carrying terminal (e.g., between a collector and an emitter) connected between the signal input line and the ground line and turning on or off in response to the control voltage given between the current carrying terminal connected to the ground line and the control terminal (i.e., between a base and the emitter); a capacitive element connected between the signal input line and the control terminal of the transistor; and a resistive element connected between the control terminal of the transistor and the ground line. In this configuration, when the AC noise changes in the positive direction, due to the series configuration of the capacitive element and the resistive element, a voltage drop occurs in the resistive element through the capacitive element to turn on the transistor. As a result, the voltage of the AC noise superimposed on the signal input line is clamped at the +Vp level.

Between the signal input line and the capacitive element, a resistor may also be arranged. By setting the resistance value of the resistor as required, the clamp level can be adjusted.

Between the signal input line and the capacitive element, a diode having an anode connected to the signal input line may also be arranged. Since the diode has a substantially constant forward voltage, the clamp level can be adjusted in accordance with the voltage.

The first protection circuit may also include: a diode having an anode connected to the signal input line; and a Zener diode having a cathode connected to the signal input line, and the diode and the Zener diode are connected in series between the signal input line and the ground line. In this configuration, the positive voltage of the AC noise superimposed on the signal input line is clamped at a level obtained by adding up the forward voltage of the diode and the Zener voltage of the Zener diode.

The second protection circuit may also include one or a plurality of diodes connected in series between the signal input line and the ground line and respectively having a cathode connected to the signal input line. In this configuration, the negative voltage of the AC noise superimposed on the signal input line is clamped at a level which is n times (where n=1, 2, . . . ) the forward voltage of the diode.

The second protection circuit may also include: a transistor having a current carrying terminal connected between the signal input line and the ground line and which turns on or off in response to a control voltage given between the current carrying terminal connected to the signal input line and the control terminal; a capacitive element connected between the control terminal of the transistor and the ground line; and a resistive element connected between the signal input line and the control terminal of the transistor. In this configuration, the voltage of the AC noise superimposed on the signal input line is clamped at the level −Vn.

Between the capacitive element and the ground line, a resistor may also be arranged. By setting the resistance value of the resistor as required, the clamp level can be adjusted.

Between the capacitive element and the ground line, a diode having an anode connected to the ground line may also be arranged. Since the diode has a substantially constant forward voltage, the clamp level can be adjusted in accordance with the voltage.

The second protection circuit may include: a diode having a cathode connected to the signal input line; and a Zener diode having an anode connected to the signal input line, and the diode and the Zener diode are connected in series between the signal input line and the ground line. In this configuration, the negative voltage of the AC noise superimposed on the signal input line is clamped at a level obtained by adding up the forward voltage of the diode and the Zener voltage of the Zener diode.

Zener diodes connected in series so as to have mutually opposite polarities may also be connected in parallel to the capacitive element. This configuration allows the capacitive element to be protected from a high-frequency surge resulting from ESD or the like. In addition, since the Zener diodes connected in series have a Zener capacitance, by allowing the Zener diodes and the capacitive element to complement each other with regard to frequency properties, it is possible to maintain a clamping function on the AC noise in a wider frequency band.

An ignition device for an internal combustion engine according to a second aspect of the present disclosure includes a switching element which applies or interrupts current flow in an ignition coil (i.e., a load), and the drive control circuit described above which generates the drive signal for the switching element. In accordance with the second aspect, even in a more severe noise environment, the ignition coil can normally be driven.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

In each of embodiments, substantially the identical parts are designated by the identical reference numerals and a description thereof is omitted.

(First Embodiment)

The following will describe the first embodiment of the present disclosure with reference to FIGS. 1 to 3C. An ignition device (i.e., an ignition device for an internal combustion engine) shown in FIG. 1 includes a control IC 2, an IGBT 3, and an ignition coil 4. The control IC 2 is a drive control circuit that outputs a drive signal (i.e., a gate signal) for driving the IGBT 3 to turn on or off in response to an ignition signal (i.e., an input signal) sent from an engine ECU 5 through a wire line W.

Figure 1:
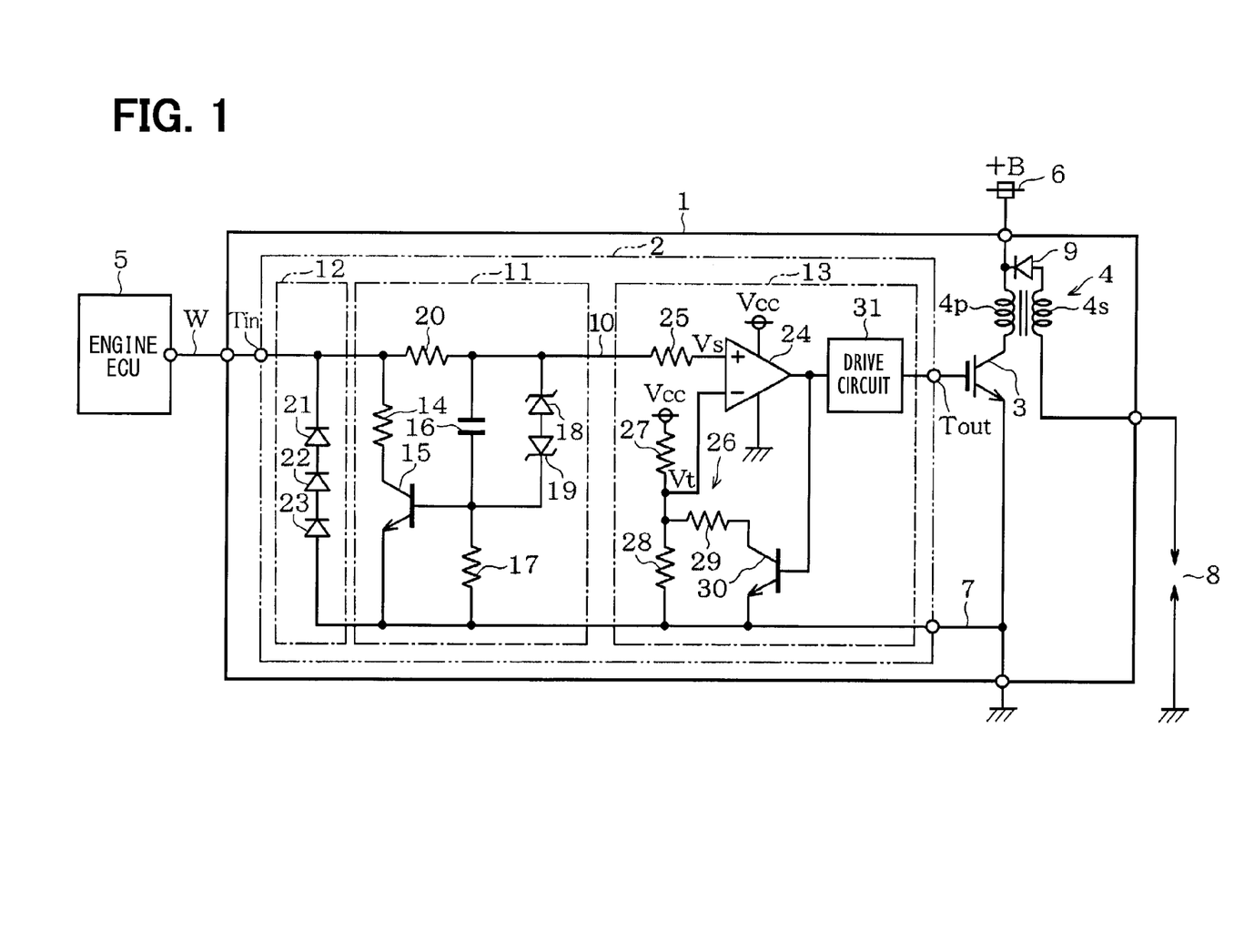
FIG. 1 is a diagram that shows the configuration of an ignition device for illustrating a first embodiment of the present disclosure.

The IGBT 3 is a switching element for applying or interrupting current flow in the ignition coil 4 (i.e., a load), which is provided separately from the control IC 2. Between a power supply line 6 to which a battery voltage +B is supplied and a ground line 7, a primary coil 4p of the ignition coil 4 and a part between the collector and the emitter of the IGBT3 are connected in series. A secondary coil 4s of the ignition coil 4 is connected to a plug 8. A diode 9 is connected between the respective coil ends of the primary coil 4p and the secondary coil 4s.

The control IC 2 receives the ignition signal inputted from an input terminal Tin and outputs a drive signal from an output terminal Tout. The control IC 2 includes: a power supply circuit (not shown) for generating a control power supply voltage Vcc (e.g., 5 V) from the battery voltage +B; a positive noise protection circuit 11 and a negative noise protection circuit 12, each of which is connected between the signal input line 10 for the ignition signal and the ground line 7; and a drive signal generation circuit 13.

The positive noise protection circuit 11 is a first protection circuit that clamps the voltage of AC noise superimposed on the signal input line 10 at a level +Vp (+Vp>0). The part between the collector and emitter (i.e., the part between current carrying terminals) of a transistor 15 is connected between the signal input line 10 and the ground line 7. A resistor 14 is connected between the signal input line 10 and the collector of the transistor 15. A capacitor 16 (i.e., a capacitive element) is connected between the signal input line 10 and the base (i.e., a control terminal) of the transistor 15. A resistor 17 (i.e., a resistive element) is connected between the base of the transistor 15 and the ground line 7. Zener diodes 18 and 19 connected in series to have opposite polarities are connected to the capacitor 16 in parallel. In the signal input line 10, a resistor 20 is provided between the connection node of the resistor 14 and the connection nodes of the capacitor 16 and the Zener diode 18.

The negative noise protection circuit 12 is a second protection circuit that clamps the voltage of the AC noise superimposed on the signal input line 10 at a level –Vn (i.e., –Vn<0). The negative noise protection circuit 12 includes diodes 21 to 23 connected in series between the signal input line 10 and the ground line 7 and each of them having a cathode connected to the signal input line 10. The number of the series-connected diodes can be changed as required.

The drive signal generation circuit 13 generates the drive signal on the basis of a comparison between a voltage Vs in the signal input line 10 and a threshold voltage Vt. The signal voltage Vs in the signal input line 10 is inputted through a resistor 25 to the non-inverting input terminal of a comparator 24, while, the threshold voltage Vt is inputted from a threshold setting circuit 26 to the inverting input terminal of the comparator 24. The threshold setting circuit 26 includes: resistors 27 and 28 which divide the power supply voltage Vcc; and a resistor 29 and a transistor 30 which are connected in series between the voltage division node and the ground line 7.

When the signal voltage Vs becomes lower than the threshold voltage Vt, the transistor 30 is turned off so that a voltage resulting from the voltage division by the resistors 27 and 28 becomes the threshold voltage Vt. When the signal voltage Vs becomes higher than the threshold voltage Vt, the transistor 30 is turned on so that a voltage resulting from the voltage division by the resistors 27, 28, and 29 becomes the threshold voltage Vt. That is, the comparator 24 has hysteresis characteristics.

A drive circuit 31 amplifies an output signal from the comparator 24 to output the drive signal (i.e., gate signal). To protect the circuit from a positive high-voltage surge and a negative high-voltage surge caused by ESD, a positive/negative surge protection circuit which is turned on when a surge is applied to the circuit is provided as necessary between the signal input line 10 and the ground line 7, though not shown.

Next, a description will be given of the function of the present embodiment with reference also to FIGS. 2A to 2C and 3A to 3C. The ignition signal output from the engine ECU 5 to the wire line W has a binary-level voltage waveform in which, e.g., a L-level voltage VL is 0 V and a H-level voltage VH is 5 V. In the absence of influence from the AC noise and surge entrance each described later, when the ignition signal shifts to the H level, the signal voltage Vs in the signal input line 10 becomes higher than the threshold voltage Vt to turn on the IGBT 3. This causes the current to rise in the primary coil 4p of the ignition coil 4. When the ignition signal shifts to the L-level, the signal voltage Vs becomes lower than the threshold voltage Vt to turn off the IGBT 3. This transfers the energy stored in the primary coil 4p to the secondary coil 4s to cause ignition at the plug 8.

In the wire line W provided in a vehicle, AC noise is likely to be induced. The AC noise has a frequency of, e.g., about 1 MHZ to 500 MHz. The AC noise also enters the control IC 2 of the ignition device 1 through the signal input line 10. In the positive noise protection circuit 11, when the voltage Vs in the signal input line 10 rises due to the AC noise, a current flows in the resistor 17 through the capacitor 16 so that the voltage of the resistor 17 drops to turn on the transistor 15. As a result, the positive noise protection circuit 11 clamps the AC noise at a level around +Vp (i.e., +Vp>0).

On the other hand, when the voltage Vs in the signal input line 10 decreases due to the AC noise, the negative noise protection circuit 12 clamps the AC noise at the level –Vn (i.e., –Vn<0). Here, Vn=3Vf (it is noted that Vf: Forward Voltage of Diode) is satisfied. The AC noise thus clamped on both positive and negative sides has a waveform shown in, e.g., FIG. 3A.

Figure 3A:
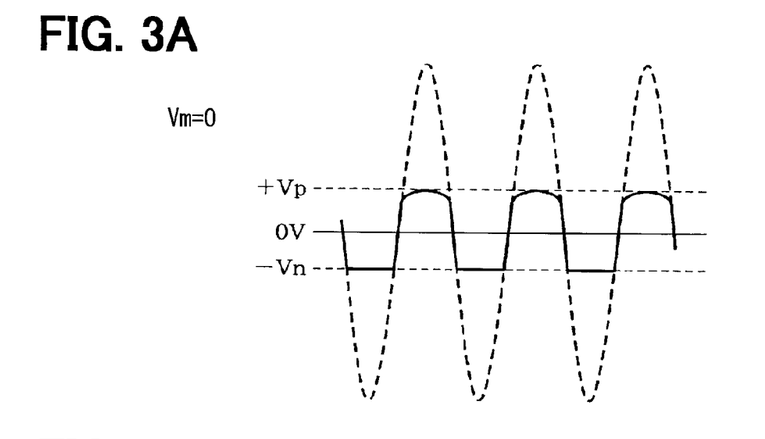
FIG. 3A is a waveform chart of clamped AC noise.
Figure 3B:
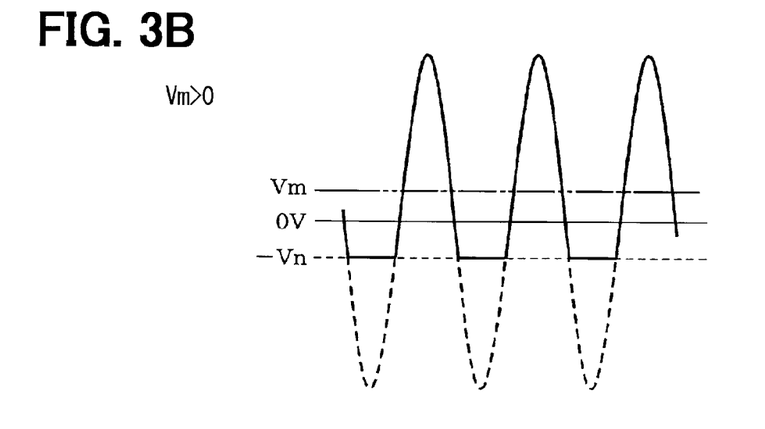
FIG. 3B is a waveform chart of the clamped AC noise.
Figure 3C:
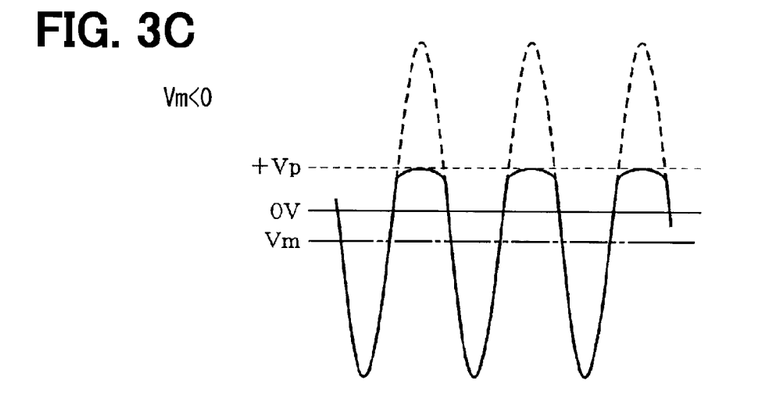
FIG. 3C is a waveform chart of the clamped AC noise.

By contrast, when the positive noise protection circuit 11 is not provided or the magnitude Vp of the positive clamp level is larger than the amplitude of the AC noise, only the negative voltage side of the AC noise is clamped. In this case, as shown in FIG. 3B, the AC noise has a positive-negative asymmetrical waveform, and a mean voltage Vm of the clamped AC noise has a positive value. Conversely, when the negative noise protection circuit 12 is not provided or the magnitude Vn of the negative clamp level is larger than the amplitude of the AC noise, only the positive voltage side of the AC noise is clamped. In this case, as shown in FIG. 3C, the AC noise has a positive-negative asymmetrical waveform, and the mean voltage Vm of the clamped AC noise has a negative value.

Figure 2A:
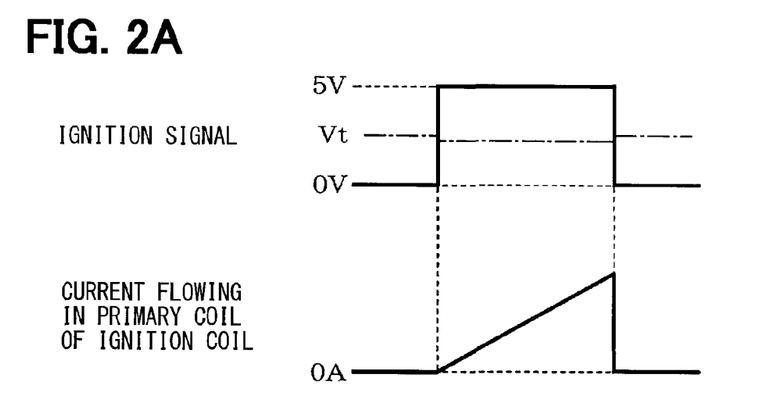
FIG. 2A is a waveform chart that shows an ignition signal on a signal input line and a current flowing in a primary coil of an ignition coil.
Figure 2B:
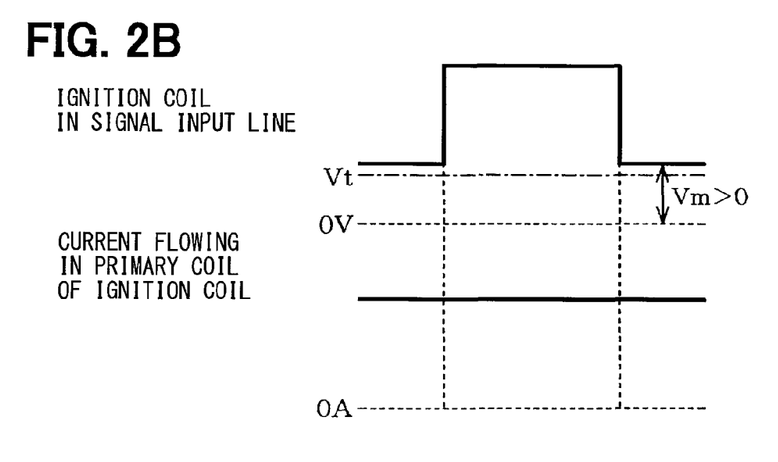
FIG. 2B is a waveform chart that shows the ignition signal on the signal input line and the current flowing in the primary coil of the ignition coil.
Figure 2C:
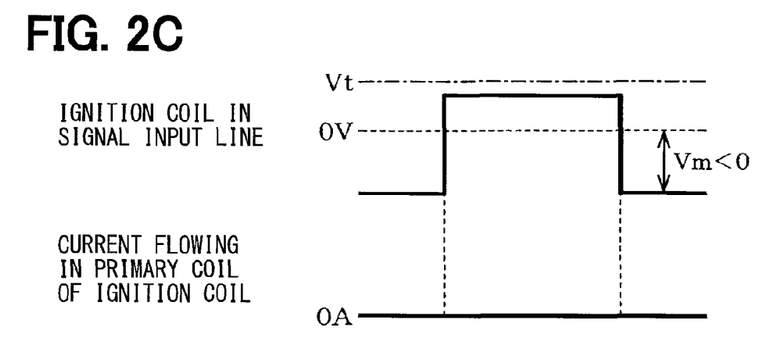
FIG. 2C is a waveform chart that shows the ignition signal on the signal input line and the current flowing in the primary coil of the ignition coil.

When the mean voltage Vm of the clamped AC noise becomes positive, as shown in FIG. 2B, the ignition signal inputted to the signal input line 10 is shifted by the mean voltage Vm in a positive direction. On the other hand, when the mean voltage Vm of the clamped AC noise becomes negative, as shown in FIG. 2C, the ignition signal inputted to the signal input line 10 is shifted by the mean voltage Vm in a negative direction.

The comparator 24 compares the shifted signal voltage Vs to the threshold voltage Vt. As a result, when the mean voltage Vm has a value not less than the threshold voltage Tt, even though the ignition signal is at the L-level, the IGBT 3 is turned on. Conversely, when the mean voltage Vm has a value not more than (i.e., Threshold Voltage Vt−5V), even though the ignition signal is at the H-level, the IGBT 3 is turned off.

In general, when the mean voltage Vm of the AC noise after clamped becomes positive, the voltage level of the ignition signal input to the signal input line 10 shifts in the positive direction, and the margin between the L-level voltage VL and the threshold voltage Vt decreases from Vt to Vt−Vm. When the mean voltage Vm of the AC noise after clamped becomes negative, the voltage level of the ignition signal input to the signal input line 10 shifts in the negative direction, and the margin between the H-level voltage VH and the threshold voltage Vt decreases from VH−Vt to VH−Vt+Vm.

To prevent the drive signal generation circuit 13 from erroneously determining the level of the ignition signal, it is necessary to set the clamp levels +Vp and −Vn so as to satisfy the following expression (1).

$$(Vt-VH) < Vm < (Vt-VL) \qquad (1)$$

That is, the clamp characteristic (Clamp Level: +Vp) of the positive noise protection circuit 11 is determined such that the H-level of the ignition signal on which the AC noise is superimposed is higher than the threshold voltage Vt. The clamp characteristic (Clamp Level: −Vn) of the negative noise protection circuit 12 is determined such that the L level of the ignition signal on which the AC noise is superimposed is lower than the threshold voltage Vt.

In the case where the AC noise before clamped has positive-negative asymmetry such as that of a sine wave, when the magnitude of the clamp level +Vp of the positive noise protection circuit 11 and the magnitude of the clamp level −Vn of the negative noise protection circuit 12 are set equal, the mean voltage Vm of the clamped AC noise becomes zero.

The clamp level +Vp of the positive noise protection circuit 11 is set by adjusting a base current and a collector current in the transistor 15. Adjustment elements for adjusting the base current and the collector current are the impedances of the capacitor 16 and the resistors 17 and 20 at the frequency of the AC noise. The clamp level −Vn of the negative noise protection circuit 12 is set by adjusting the number of series-connected diodes. By adjusting at least one of the clamp levels +Vp and −Vn, it is possible to bring the mean voltage Vm closer to zero.

Note that, when the ignition signal shifts from the L level to the H level also, the positive noise protection circuit 11 temporarily turns on the transistor 15. However, the circuit constant of the positive noise protection circuit 11 is set in accordance with the frequency band of the AC noise. The repetitive frequency of the ignition signal is significantly lower than the frequency of the AC noise. Accordingly, after the ignition signal has risen to the H level, the transistor 15 is in an off-state so that no clamping action is performed on the ignition signal.

As described above, the ignition device 1 in the present embodiment includes the positive noise protection circuit 11 and the negative noise protection circuit 12 and clamps both of the positive and negative voltages of the AC noise superimposed on the signal input line 10. This improves the positive-negative asymmetry of the clamped AC noise waveform and thus allows a reduction in the magnitude of the mean voltage Vm of the clamped AC noise. As a result, it is possible to inhibit fluctuations in the voltage level of the ignition signal due to the AC noise.

When the level fluctuations of the ignition signal are inhibited in the signal input line 10, it is possible to inhibit a reduction in the margin between the L-level voltage VL or the H-level voltage VH and the threshold voltage Vt. In the present embodiment, the clamp level +Vp of the positive noise protection circuit 11 and the clamp level −Vn of the negative noise protection circuit 12 are set so as to surely satisfy the expression (1) shown above. This allows the drive signal generation circuit 13 to perform normal ignition drive without erroneously determining the level of the ignition signal.

When the AC noise has positive-negative asymmetry, by setting the magnitudes of the clamp levels +Vp and −Vn equal, the mean voltage Vm of the clamped AC noise is brought to zero. Even when the AC noise has positive-negative symmetry, by individually adjusting the magnitudes of the clamp levels +Vp and −Vn, it is possible to bring the mean voltage Vm of the AC noise closer to zero. This can bring the reduction in the margin between the L-level voltage VL or the H-level voltage VH and the threshold voltage Vt to zero. Thus, the ignition device 1 in the present embodiment is more excellent in noise resistance than the conventional configuration and can be prevented from erroneous operation even in a more severe noise environment.

In the positive noise protection circuit 11, the Zener diodes 18 and 19 are connected in parallel to the capacitor 16 to allow the capacitor 16 to be protected from a high-frequency surge resulting from ESD or the like. Since each of the Zener diodes 18 and 19 has a Zener capacitance, by allowing the Zener diodes and the capacitor 16 to complement each other with regard to frequency properties, it is possible to maintain a clamping function on the AC noise in a wider frequency band.

As described above, in the configuration in which the positive noise protection circuit 11 is not provided and the bypass capacitor is connected between the signal input line 10 and the ground line 7 to allow the AC noise to pass through the bypass capacitor, a capacitive value of about several microfarads is required. By contrast, in the capacitor 16 provided in the positive noise protection circuit 11, a capacitive value of several tens of picofarads is sufficient. Accordingly, the positive noise protection circuit 11 can be embedded in the control IC 2. As a result, it is possible to avoid an increase in the size of the ignition device 1 and an increase in the complexity of an assembling operation.

(Second Embodiment)

Figure 4:
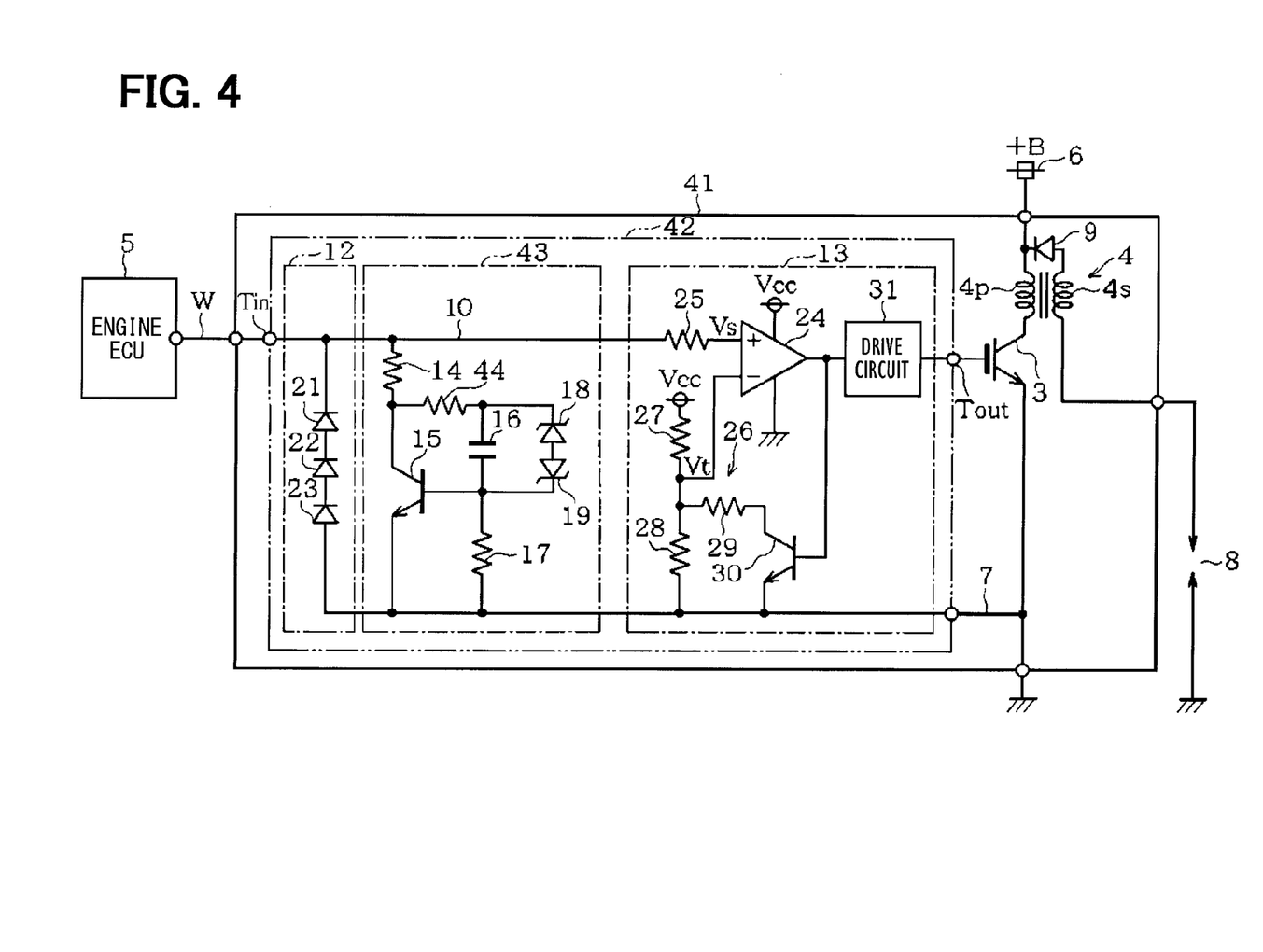
FIG. 4 is a diagram that shows the configuration of an ignition device for illustrating a second embodiment of the present disclosure.

An ignition device 41 shown in FIG. 4 is different from the ignition device 1 shown in FIG. 1 only in the configuration of a positive noise protection circuit 43 of a control IC 42. That is, in the positive noise protection circuit 43, a resistor 44 and the capacitor 16 are connected in series between the collector and base of the transistor 15 and, from the signal input line 10, the resistor 20 has been removed. To the capacitor 16, the Zener diodes 18 and 19 connected in series are connected in parallel.

In this configuration also, the capacitor 16 is connected between the signal input line 10 and the base of the transistor 15 through the resistors 14 and 44. The configuration of the positive noise protection circuit 43 is otherwise the same as that of the positive noise protection circuit 11. The resistors 14 and 44 serve as adjustment elements for a base current and a collector current in the transistor 15. From the present embodiment also, the same function and effect as those obtained from the first embodiment can be obtained.

(Third Embodiment)

Figure 5:
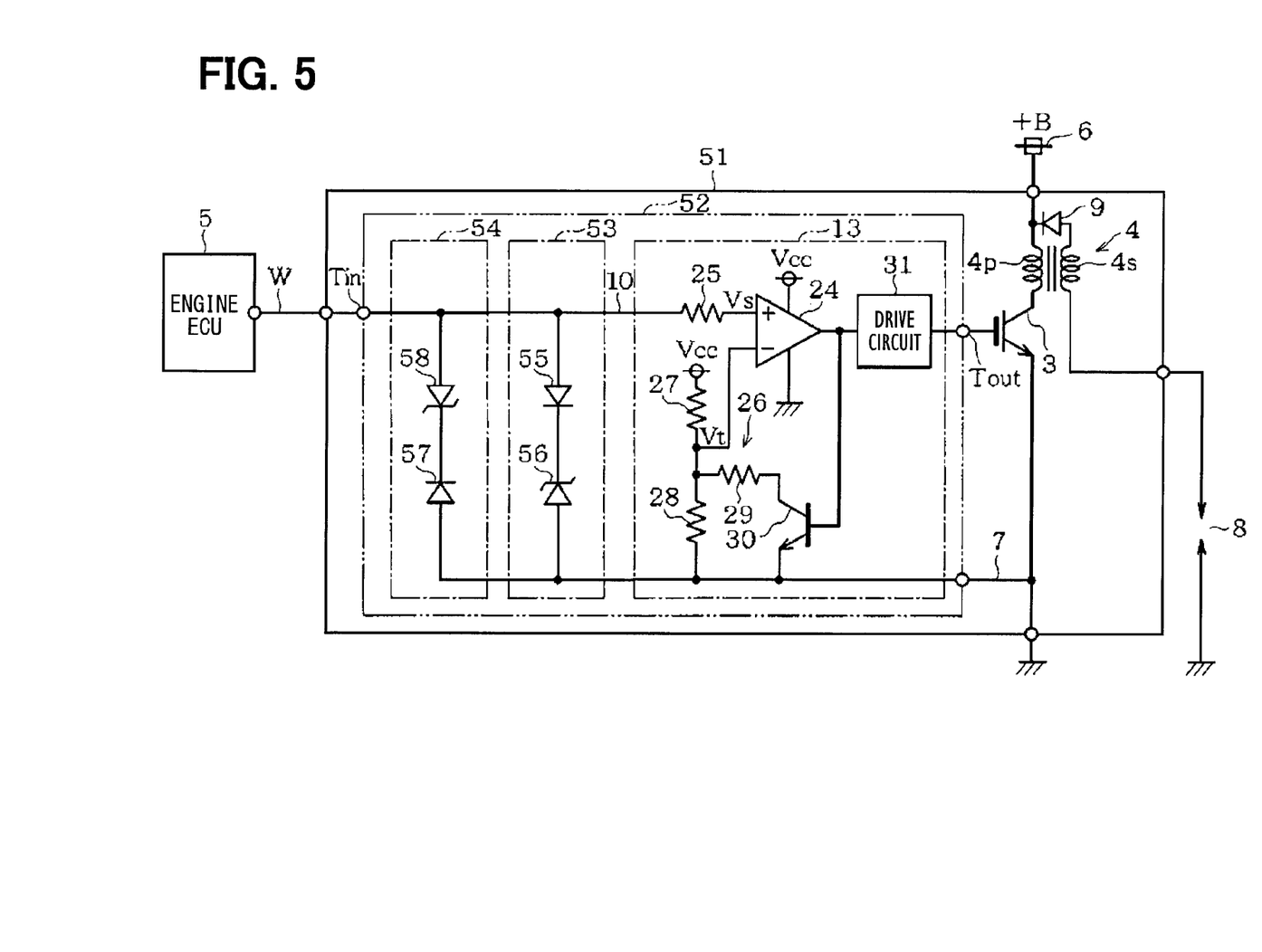
FIG. 5 is a diagram that shows the configuration of an ignition device for illustrating a third embodiment of the present disclosure.

An ignition device 51 shown in FIG. 5 is different from the ignition device 1 shown in FIG. 1 in the configurations of a positive noise protection circuit 53 and a negative noise protection circuit 54 of a control IC 52. The positive noise protection circuit 53 has the configuration in which, between the signal input line 10 and the ground line 7, a diode 55 having an anode connected to the signal input line 10 and a Zener diode 56 having a cathode connected to the signal input line 10 are connected in series. The negative noise protection circuit 54 has the configuration in which, between the signal input line 10 and the ground line 7, a diode 57 having a cathode connected to the signal input line 10 and a Zener diode 58 having an anode connected to the signal input line 10 are connected in series.

The clamp level +Vp of the positive noise protection circuit 53 results in a voltage obtained by adding a forward voltage Vf of the diode 55 to the Zener voltage of the Zener diode 56. The clamp level −Vn of the negative noise protection circuit 54 also results in a voltage obtained by adding the forward voltage Vf of the diode 57 to the Zener voltage of the Zener diode 58. When the AC noise before clamped has positive-negative asymmetry such as that of a sine wave, by setting the Zener voltages of the Zener diodes 56 and 58 equal, it is possible to bring the mean voltage Vm of the clamped AC noise to zero. From the present embodiment also, the same function and effect as those obtained from the first embodiment can be obtained.

(Fourth Embodiment)

Figure 6:
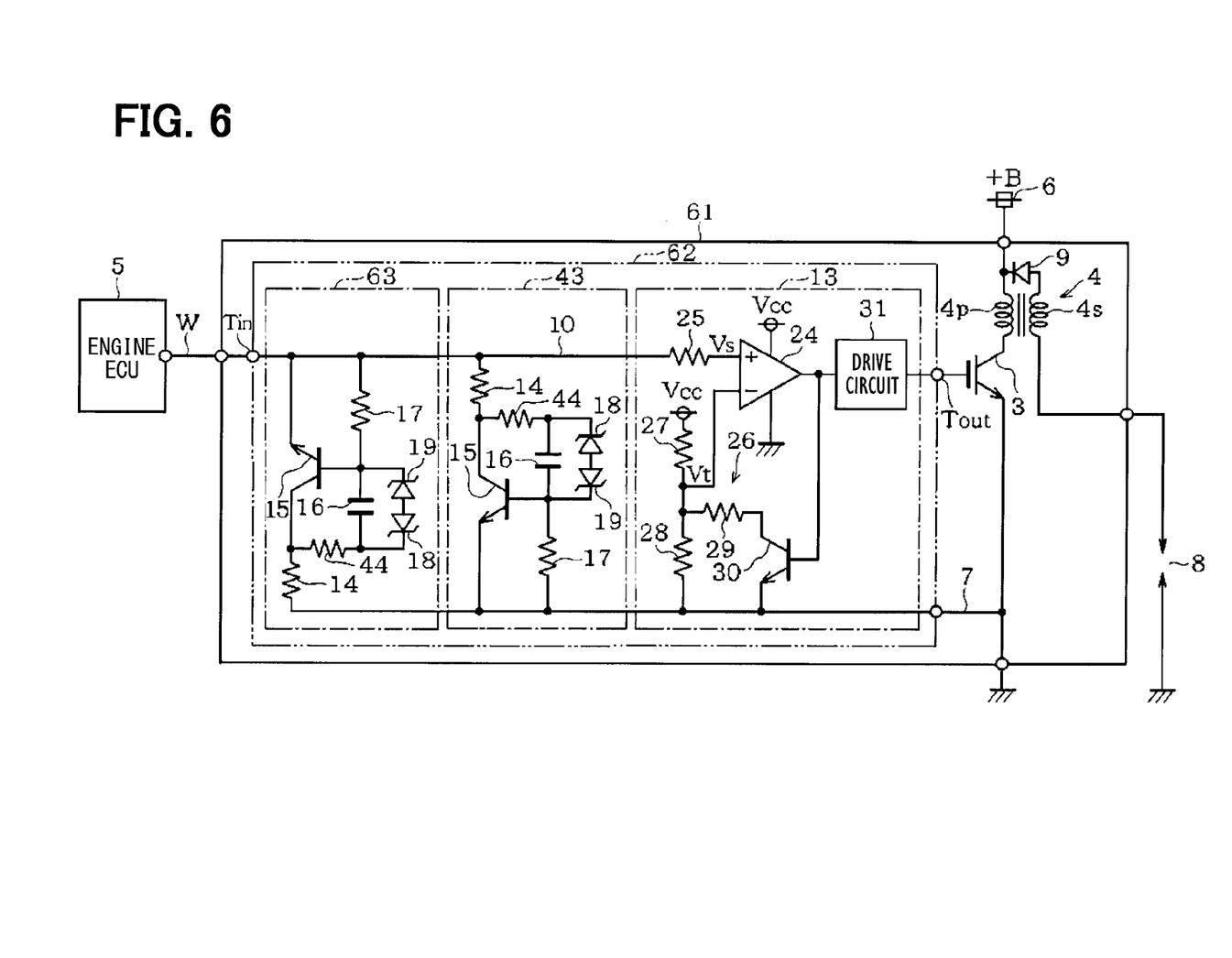
FIG. 6 is a diagram that shows the configuration of an ignition device for illustrating a fourth embodiment of the present disclosure.

An ignition device 61 shown in FIG. 6 includes, in a control IC 62, the positive noise protection circuit 43 shown in FIG. 4 and a negative noise protection circuit 63 which is the same circuit as the positive noise protection circuit 43 reversely connected to the signal input line 10 and the ground line 7. The configuration of the ignition device 61 is otherwise the same as that of the ignition device 1. As will be understood, the negative noise protection circuit 63 acts on the negative voltage of the AC noise similarly to the positive noise protection circuit 43. From the present embodiment also, the same function and effect as those obtained from the first and second embodiments can be obtained. In addition, when the same circuit constant is used in each of the positive noise protection circuit 43 and the negative noise protection circuit 63, the magnitudes of the clamp levels +Vp and −Vn are equal.

(Fifth Embodiment)

Figure 7:
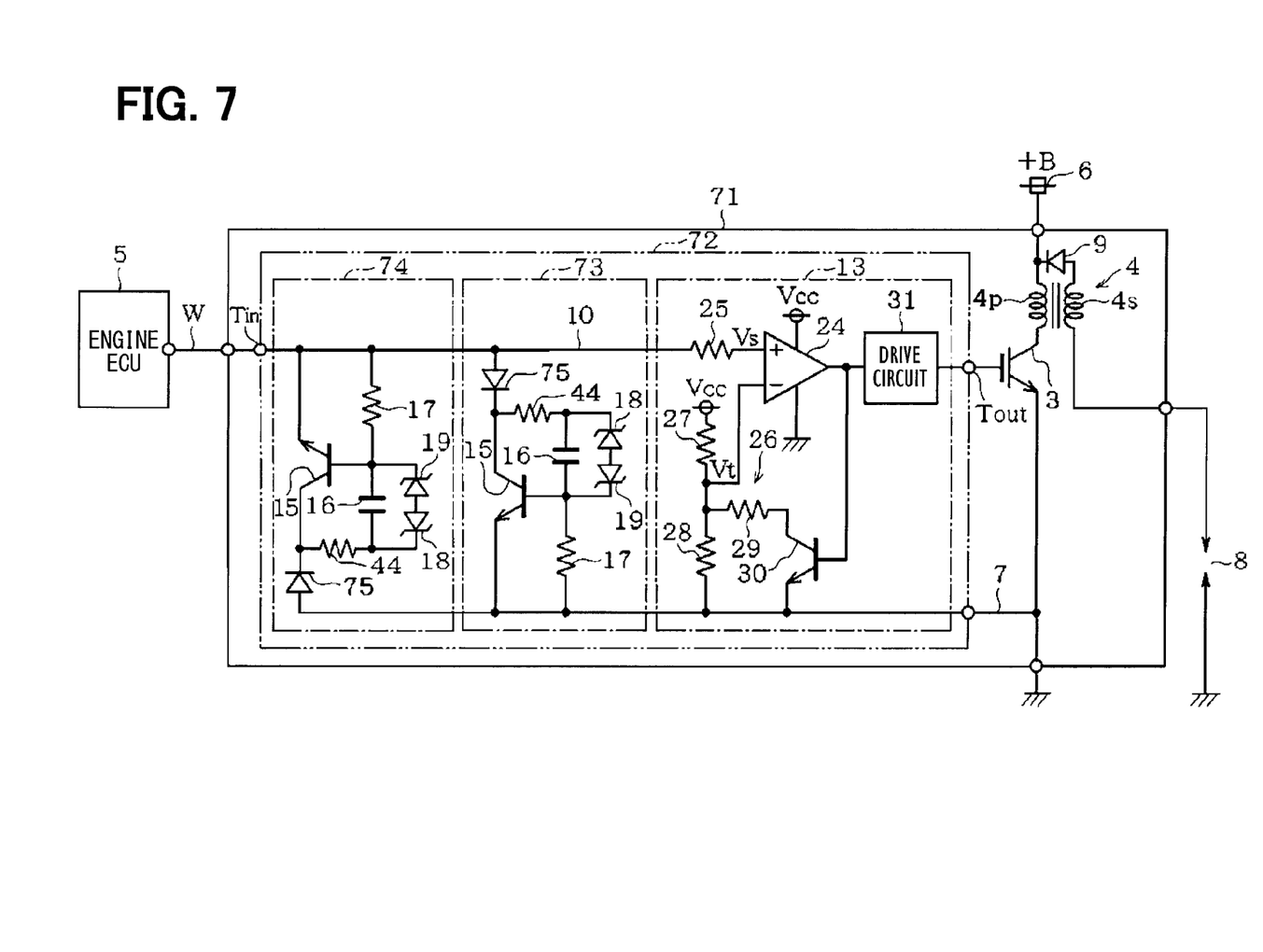
FIG. 7 is a diagram that shows the configuration of an ignition device for illustrating a fifth embodiment of the present disclosure.

An ignition device 71 shown in FIG. 7 is different from the ignition device 61 shown in FIG. 6 in the configurations of a positive noise protection circuit 73 and a negative noise protection circuit 74 of a control IC 72. The positive noise protection circuit 73 and the negative noise protection circuit 74 are obtained by replacing each of the resistors 14 of the positive noise protection circuit 43 and the negative noise protection circuit 63 with a diode 75.

When the resistor 14 is used, the voltage applied between the collector and emitter (or collector and base) of the transistor 15 changes in accordance with a current. By contrast, when the diode 75 is used, the voltage applied between the collector and emitter (or collector and base) of the transistor 15 decreases by a given voltage irrespective of the magnitude of a current. This improves the prospect of adjusting the clamp levels +Vp and −Vn and facilitates the adjustment. Besides, the same function and effect as those obtained from the first and second embodiments can be obtained.

(Modifications)

While the preferred embodiments of the present disclosure have been described above, the present disclosure is not limited to the embodiments described above. The present disclosure can variously be modified or expanded within a range not departing from the gist thereof.

The present disclosure may also be configured by arbitrarily combining the circuit selected from among the positive noise protection circuits 11, 43, 53, and 73 with the circuit selected from among the negative noise protection circuits 12, 54, 63, and 74.

Instead of the capacitor 16, a series circuit including a capacitive element, e.g., a capacitor and a resistor may also be provided. Instead of the resistor 17, a series circuit including a resistive element, e.g., a resistor and a capacitor may also be provided. The resistor 44 may appropriately be provided as necessary. The Zener diodes 18 and 19 may appropriately be provided as necessary.

In each of the second to fifth embodiments also, by adjusting at least one of the clamp levels +Vp and −Vn, it is possible to bring the mean voltage Vm closer to zero.

The drive signal generation circuit 13 may appropriately be provided with hysteresis characteristics as necessary.

Instead of the transistor 15 having the current carrying terminals (i.e., a collector and an emitter) and the control terminals (i.e., a base), a FET having current carrying terminals (i.e., a drain and a source) and a control terminal (i.e., a gate) may also be used.

Instead of the IGBT 3, a switching element of another type such as a MOSFET may also be used.

In each of the embodiments described above, the IGBT 3 may also be configured as a semiconductor chip or configured to include a discrete element. Instead of configuring the IGBT 3 and the control IC 2, 42, 52, 62, or 72 as separate semiconductor chips (i.e., a multi-chip configuration), the IGBT 3 and the control IC 2, 42, 52, 62, or 72 may also be configured as one semiconductor chip (i.e., a single-chip configuration).

The application of the drive control circuit of the present disclosure is not limited to an ignition device for an internal combustion engine. The drive control circuit of the present disclosure is widely applicable to a device which generates a drive signal for a switching element in accordance with an input signal.

The invention claimed is:

1. A drive control circuit that generates a drive signal for a switching element applying or interrupting current flow in a load in response to an input signal, comprising:
   a first protection circuit that is connected between a signal input line for the input signal and a ground line and clamps a voltage of an AC noise superimposed on the signal input line at one clamp level;
   a second protection circuit that is connected between the signal input line and the ground line, and clamps the voltage of the AC noise superimposed on the signal input line at another clamp level; and a drive signal generation circuit that generates the drive signal based on a comparison between a voltage in the signal input line and a threshold value, wherein:

the input signal has binary levels including an L-level voltage and an H-level voltage; and the one clamp level and the other clamp level are set such that a mean voltage of the AC noise clamped at the one clamp level and the other clamp level is lower than a differential voltage between the threshold voltage and the L-level voltage and higher than a differential voltage between the threshold voltage and the H-level voltage;

wherein the one clamp level is larger than zero; and wherein the other clamp level is smaller than zero.

2. The drive control circuit according to claim 1, wherein the first protection circuit includes:

a transistor having a current carrying terminal connected between the signal input line and the ground line, and turning on or off in response to a control voltage given between the current carrying terminal connected to the ground line and a control terminal;

a capacitive element that is connected between the signal input line and the control terminal of the transistor; and a resistive element that is connected between the control terminal of the transistor and the ground line.

3. The drive control circuit according to claim 2, wherein a resistor is arranged between the signal input line and the capacitive element.

4. The drive control circuit according to claim 2, wherein a diode has an anode connected to the signal input line, and is arranged between the signal input line and the capacitive element.

5. The drive control circuit according to claim 1, wherein the first protection circuit includes: a diode having an anode connected to the signal input line; and a Zener diode having a cathode connected to the signal input line, and the diode and the Zener diode are connected in series between the signal input line and the ground line.

6. The drive control circuit according to claim 1, wherein the second protection circuit includes one or a plurality of diodes connected in series between the signal input line and the ground line, and respectively having a cathode connected to the signal input line.

7. The drive control circuit according to claim 1, wherein the second protection circuit includes:

a transistor having a current carrying terminal connected between the signal input line and the ground line, and turning on or off in response to a control voltage given between the current carrying terminal connected to the signal input line and a control terminal;

a capacitive element that is connected between the control terminal of the transistor and the ground line; and a resistive element that is connected between the signal input line and the control terminal of the transistor.

8. The drive control circuit according to claim 7, wherein a resistor is arranged between the capacitive element and the ground line.

9. The drive control circuit according to claim 7, wherein a diode has an anode connected to the ground line, and is arranged between the capacitive element and the ground line.

10. The drive control circuit according to claim 1, wherein the second protection circuit includes: a diode having a cathode connected to the signal input line; and a Zener diode having an anode connected to the signal input line, the diode and the Zener diode are connected in series between the signal input line and the ground line.

11. The drive control circuit according to claim 2, wherein a plurality of Zener diodes connected in series so as to have mutually opposite polarities are connected to the capacitive element in parallel.

12. An ignition device for an internal combustion engine, comprising:

a switching element that applies or interrupts current flow in an ignition coil; and the drive control circuit according to claim 1 that generates the drive signal for the switching element.

* * * * *